(12) United States Patent
Seff et al.

(10) Patent No.: US 7,522,406 B2
(45) Date of Patent: Apr. 21, 2009

(54) METER CENTER, AND SOCKET ASSEMBLY AND JAW ASSEMBLY THEREFOR

(75) Inventors: Paul David Seff, Williamsburg, VA (US); Serle Keith Cupp, Mason City, IL (US)

(73) Assignee: Eaton Corporation, Cleveland, OH (US)

( * ) Notice: Subject to any disclaimer, the term of this patent is extended or adjusted under 35 U.S.C. 154(b) by 72 days.

(21) Appl. No.: 11/830,971

(22) Filed: Jul. 31, 2007

(65) Prior Publication Data

US 2009/0034168 A1 Feb. 5, 2009

(51) Int. Cl.
*H01R 33/945* (2006.01)

(52) U.S. Cl. ............ 361/670; 361/660; 361/668; 439/146; 439/508; 439/517

(58) Field of Classification Search ......... 361/658–670, 361/102, 636; 439/146, 508, 517, 557, 167, 439/511, 747, 839, 861, 856–858
See application file for complete search history.

(56) References Cited

U.S. PATENT DOCUMENTS

| | | | | | |
|---|---|---|---|---|---|
| 3,731,253 | A | * | 5/1973 | Coffey | 439/745 |
| 3,880,494 | A | * | 4/1975 | Reed et al. | 439/517 |
| 3,914,006 | A | * | 10/1975 | Hayward | 439/517 |
| 4,201,439 | A | * | 5/1980 | M'Sadoques | 439/839 |
| 4,690,483 | A | * | 9/1987 | Carris | 439/517 |
| 5,762,522 | A | * | 6/1998 | Robinson et al. | 439/517 |
| 5,951,324 | A | * | 9/1999 | Campbell et al. | 439/517 |
| 5,980,311 | A | * | 11/1999 | Campbell et al. | 439/517 |
| 5,982,611 | A | * | 11/1999 | Campbell et al. | 361/664 |
| 5,997,347 | A | * | 12/1999 | Robinson et al. | 439/517 |
| 6,012,937 | A | * | 1/2000 | Campbell et al. | 439/212 |
| 6,015,314 | A | * | 1/2000 | Benfante | 439/517 |
| 6,104,586 | A | * | 8/2000 | Robinson | 361/102 |
| 6,561,844 | B1 | * | 5/2003 | Johnson | 439/507 |
| 6,663,422 | B1 | * | 12/2003 | Robinson et al. | 439/517 |
| 6,793,542 | B1 | | 9/2004 | White | |
| 6,921,290 | B1 | * | 7/2005 | Kellerman | 439/517 |
| 6,945,813 | B1 | * | 9/2005 | Kellerman | 439/517 |
| 7,018,247 | B1 | | 3/2006 | Ranta et al. | |
| 7,040,921 | B2 | * | 5/2006 | Kellerman | 439/517 |
| 7,147,507 | B2 | * | 12/2006 | Johnson | 439/517 |
| 7,232,335 | B2 | * | 6/2007 | Preuhs et al. | 439/518 |
| 7,239,502 | B1 | * | 7/2007 | Seff et al. | 361/624 |
| 2002/0182930 | A1 | | 12/2002 | Seff et al. | |
| 2003/0092312 | A1 | | 5/2003 | Johnson | |
| 2006/0063423 | A1 | | 3/2006 | Seff et al. | |
| 2006/0178044 | A1 | | 8/2006 | Johnson | |

* cited by examiner

*Primary Examiner*—Michael V Datskovskiy
(74) *Attorney, Agent, or Firm*—Martin J. Moran

(57) ABSTRACT

A socket assembly for a meter center including a plurality of meters is provided having a plate member and plural jaw assemblies. The plate member includes apertures for housing the jaw assemblies and structures associated with each of the apertures which function to both assist in initial alignment of the jaw assemblies during installation as well as to provide lateral support to, and maintain alignment of, the jaw assemblies after installation. The plate member further includes protrusions extending inwardly from the side walls of the apertures. The protrusions engage openings in side portions of the jaw assemblies.

20 Claims, 5 Drawing Sheets

METER CENTER, AND SOCKET ASSEMBLY AND JAW ASSEMBLY THEREFOR

BACKGROUND OF THE INVENTION

1. Field of the Invention

The invention relates generally to electric power distribution systems and, more particularly, to socket assemblies for meter centers. The invention also relates to jaw assemblies for meter socket assemblies.

2. Background Information

Meter centers including a number of watt-hour meters are commonly used for metering electric power delivered to the tenant(s) of a residence (e.g., without limitation, a single family home; an apartment building) or commercial site (e.g., without limitation, an office complex).

A typical electrical meter center 1 is illustrated in FIG. 1. The meter center 1 includes a cabinet 3, having a plurality (only one is shown in FIG. 1) of meter socket assemblies 5. Each meter socket assembly 5 includes a plate member 7, to which the various components of the socket assembly 5 are secured. Electrical power is supplied to the meter center 1 by feeder buses 9. Feeder buses 9, which typically consist of three phase buses and a neutral that are electrically connected to the utility lines (not shown), extend horizontally from the cabinet 3, as shown in FIG. 1. A pair of vertical supply buses (not shown) is electrically connected to the feeder buses 9 within the cabinet 3. Each meter socket assembly 5 mounts a meter 11 for each tenant circuit and electrically connects the meter 11 to the feeder buses 9 and the supply buses (not shown). Typically, the electrical connections between the meter 11 and socket assembly 5 are made by plug-in jaws 17, which engage corresponding stabs 19 on the meter 11. The use of the plug-in jaws 17 within the meter socket 5, and corresponding stabs 19 on the back of the meter 11, permits the meter 11 to be removed from the socket 5 when servicing the meter 11 is desired.

In known designs, the connectors which incorporate the plug-in jaws were bolted to the plate member and to a corresponding one of the feeder buses or supply buses. This resulted in roughly 20 bolted connections in the electrical current path. Such connections required labor to complete and were subject to heating if they became loose.

U.S. Pat. No. 5,951,324 discloses a socket assembly, which is intended to overcome the disadvantages of the multiple bolted connections. The socket assembly provides a plate member having a plurality of through apertures and double ended fastenerless meter jaws extending through the apertures with one end of each double ended meter jaw projecting from opposing first and second sides of the plate member. Assembly of the socket assembly involves pushing one end of each jaw into a corresponding aperture until a pair of locking tabs pass through the aperture and expand outwardly to lock the jaw in place. This eliminates current-carrying joints requiring fasteners, which can become loose between the meters and the supply and tenant buses. This also requires relatively less labor to install and remove meter sockets.

Despite these improvements, there are drawbacks to the above proposal. One such drawback occurs when installing a meter having a plurality of stab contacts that must be engaged with the plural jaws on the socket assembly. Slight misalignment of the meter or variations in clamping force of the jaws can result in high insertion forces being encountered when inserting the stab contacts of the meter into the jaws of the socket assembly. Such high insertion forces can sometimes cause jaw spring clips to become misaligned or be forced through the socket base leading to improper contact engagement and damage to the meter and/or meter center and potentially complete installment failure.

Accordingly, there is room for improvement in meter centers, socket assemblies for meter centers, and in jaw assemblies therefore.

SUMMARY OF THE INVENTION

These needs and others are met by the embodiments of the invention, which provide members which engage, guide, and support a jaw assembly, to help retain jaw clips in desired positions within corresponding apertures of a meter socket.

In accordance with one aspect of the invention, a jaw assembly is provided for a socket assembly of a meter center which includes at least one meter. The socket assembly includes a plate member having a first side, an opposing second side and an aperture passing therethrough. The jaw assembly comprises a meter jaw and at least one protrusion. The meter jaw has a first end, a second end disposed opposite and distal from the first end, a first side, a second side disposed opposite from the first side, a first opening disposed on the first side, a second opening disposed on the second side, and a body portion structured to be disposed within the aperture. The body portion further includes at least one opening. At least one protrusion is structured to extend inwardly from a periphery of the aperture in a manner which engages the meter jaw at or about at least one opening.

The at least one protrusion may further include a second protrusion structured to extend inwardly from a periphery of the aperture in a manner which engages the meter jaw at or about another opening. The protrusions are preferably structured to maintain the meter jaw in a predetermined position with respect to the plate member.

Another aspect of the invention is directed to a socket assembly for a meter center including at least one meter having stabs. The socket assembly comprises: a plate member, at least one guide member, and at least one jaw assembly. The plate member includes a first side, an opposing second side and at least one aperture therethrough. The guide member extends generally perpendicularly outward from the first side of the plate member at or about a corresponding one of the at least one aperture. The jaw assembly comprises: a meter jaw having a first end, a second end disposed opposite and distal from the first end, and a body portion having at least one opening. The body portion of the jaw is disposed within one of the at least one aperture. At least one protrusion is structured to extend inwardly from a periphery of the corresponding one of the at least one aperture, in order to engage the meter jaw at or about a corresponding one of the at least one opening.

A further aspect of the invention is directed to a meter center having: a cabinet, a meter, and a socket assembly. The socket assembly, which is enclosed within a meter compartment of the cabinet, comprises: a plate member including a first side, an opposing second side and at least one aperture therethrough, at least one guide member extending generally perpendicularly outwardly from the first side of the plate member at or about a corresponding one of the at least one aperture and at least one jaw assembly. The jaw assembly comprises: a meter jaw having a first end, a second end disposed opposite and distal from the first end, and a body portion disposed within the corresponding one of the at least one aperture. The body portion includes at least one opening. At least one protrusion structured to extend inwardly from a periphery of the corresponding one of the at least one aperture, engages the meter jaw at or about a corresponding one of the at least one opening.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

Figure 1:
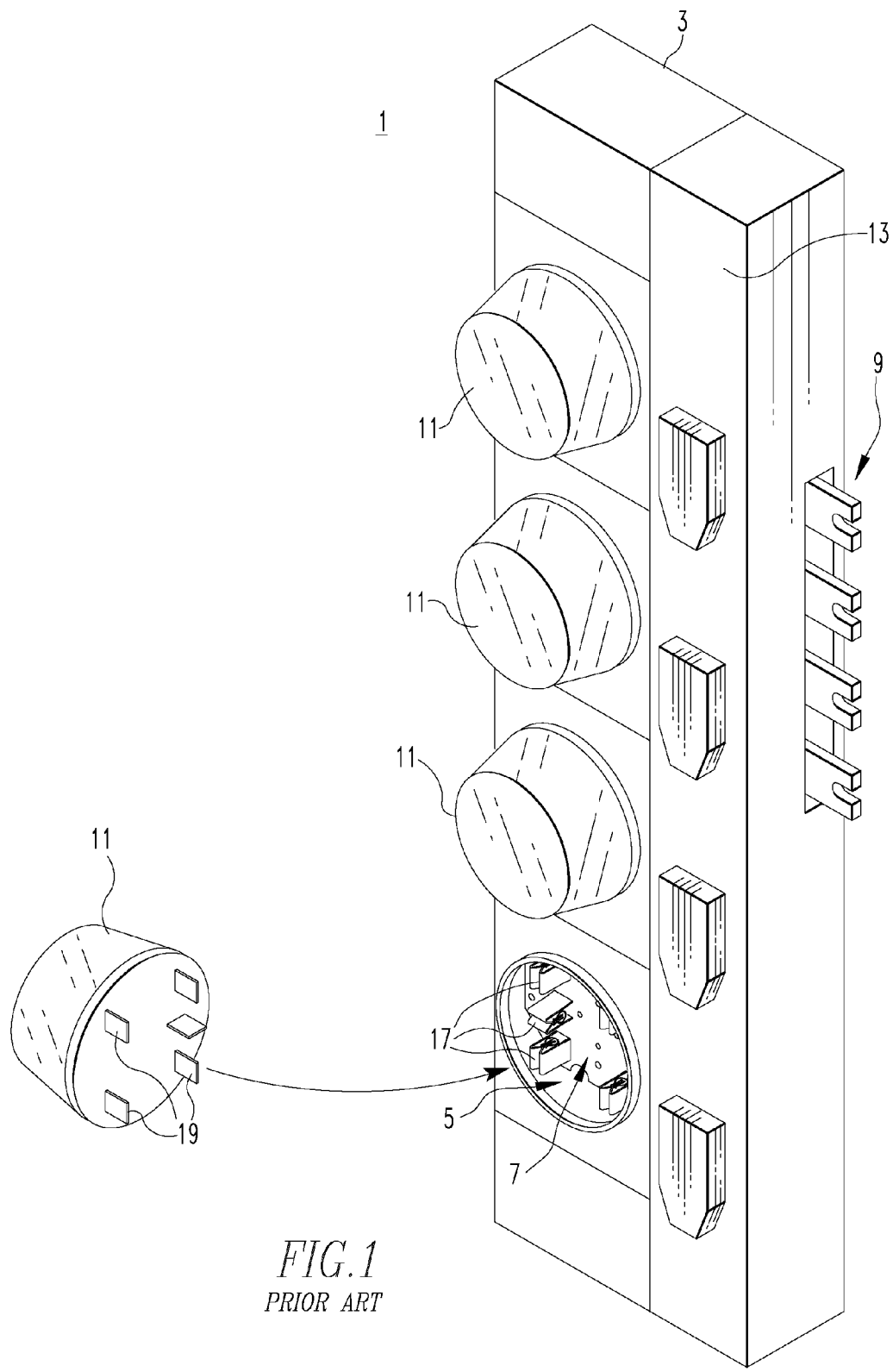
FIG. 1 is a partially exploded isometric view of a meter center.
Figure 4:
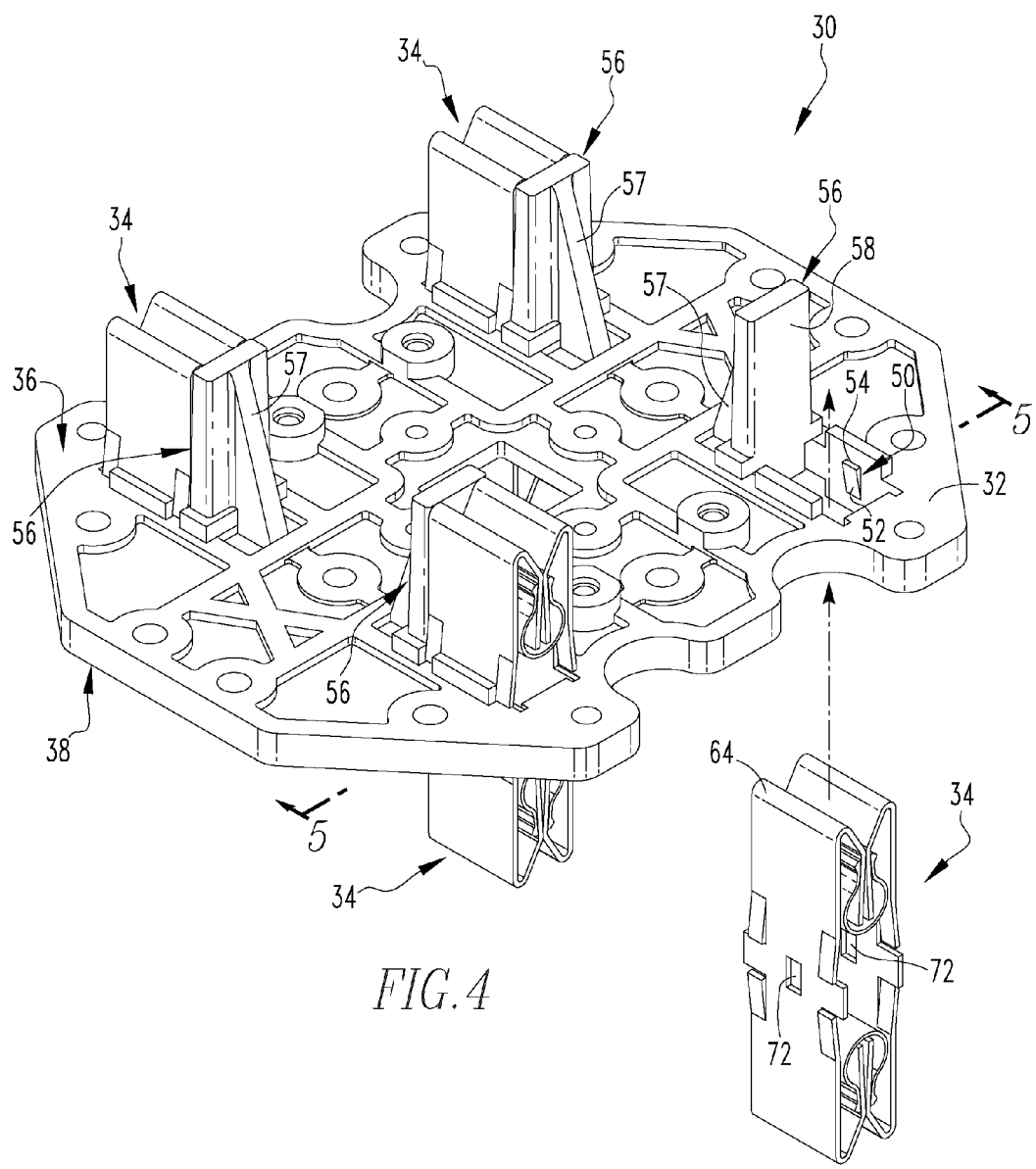
FIG. 4 is a partially exploded view of the meter socket plate of FIG. 2 with inserted meter jaws.
Figure 6:
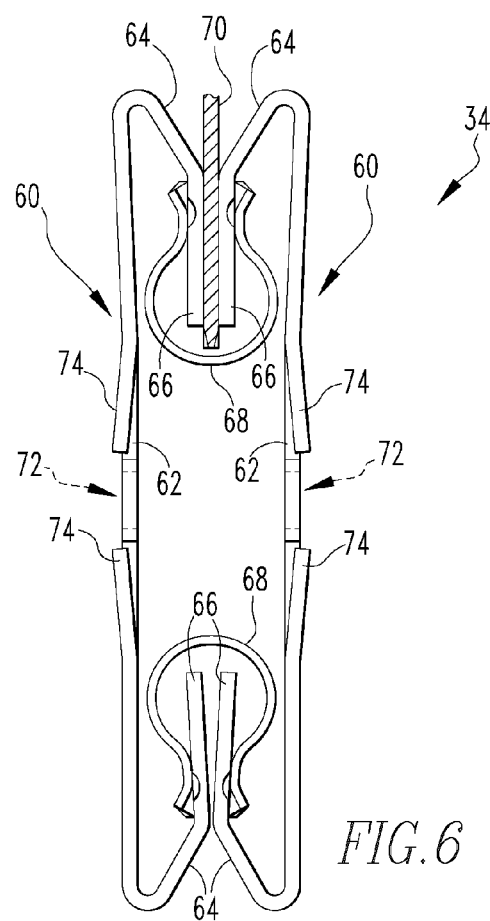
FIG. 6 is an elevation view of one of the meter jaws of FIG. 4.

FIG. 4 shows a socket assembly 30, for example, for use in place of the socket assembly 5 of FIG. 1 for mounting a meter 11 in a cabinet 3 of a meter center 1. Socket assembly 30 includes a socket plate 32 and a plurality of meter jaws 34. Meter jaws 34, best shown in FIG. 6, are preferably double ended to provide for electrical connection of the example meter 11 to feeder buses 9 inside the cabinet 3.

Figure 5:
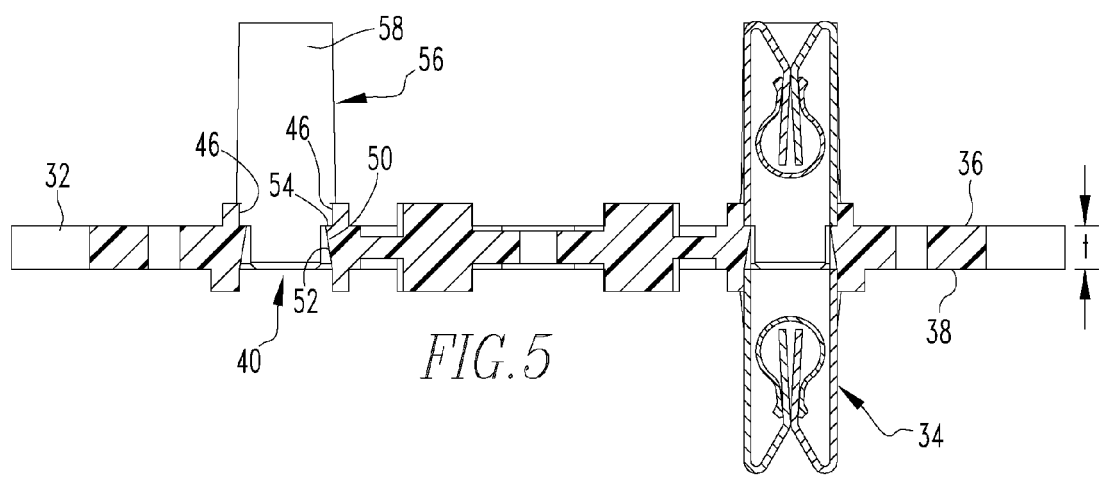
FIG. 5 is a sectional view taken along line 5-5 of FIG. 4, with one meter jaw removed.

Socket plate 32 is preferably constructed of a rigid, electrically insulating material that may be readily formed by conventional molding processes commonly known in the art. Referring to FIGS. 2-5, socket plate 32 has a first surface 36, an opposing second surface 38 and a general thickness t (FIG. 5). Additionally, socket plate 32, preferably, has two pairs 42, 44 of rectangular through apertures 40, each pair being laterally aligned and the corresponding apertures in the two pairs being vertically aligned (FIG. 3). Each of the rectangular apertures 40 is generally formed by a pair of opposing side walls 46 and two end walls 47, 48 (FIG. 3). Side walls 46 and end walls 47, 48 extend between, and are generally perpendicular to, the first surface 36 and second surface 38 of the socket plate 32. Opposing side walls 46 are generally oriented parallel to each other and perpendicular to end walls 47, 48.

Within each aperture 40, an opposing pair of stops 50 project inwardly from opposing side walls 46, one stop 50 per side wall 46. Each stop 50 is generally centrally located on one of opposing side walls 46. As shown in cross-section in FIG. 5, each stop 50 consists of a first face 52 inclined relative to opposing side walls 46 and a second face 54. Preferably, second face 54 is oriented generally perpendicular to opposing side walls 46. First face 52 provides a gradual transition from side wall 46 to an edge of second face 54. Preferably, each stop 50 is located generally near a midpoint along each side wall 46. As best shown in FIG. 5, stop 50 is preferably oriented in such a manner that second face 54 is located in relatively closer proximity to first surface 36 of socket plate 32 while the first face 52 extends from second face 54 toward second surface 38. Although stops 50 are shown as being formed integrally with socket plate 32, such stops could be separately formed and then suitably attached or coupled to socket plate 32.

Associated with each aperture 40, is a guide member 56, which generally extends away from first surface 36. Guide member 56 may be formed separate from socket plate 32 and later affixed or may be integrally formed with socket plate 32.

Figure 2:
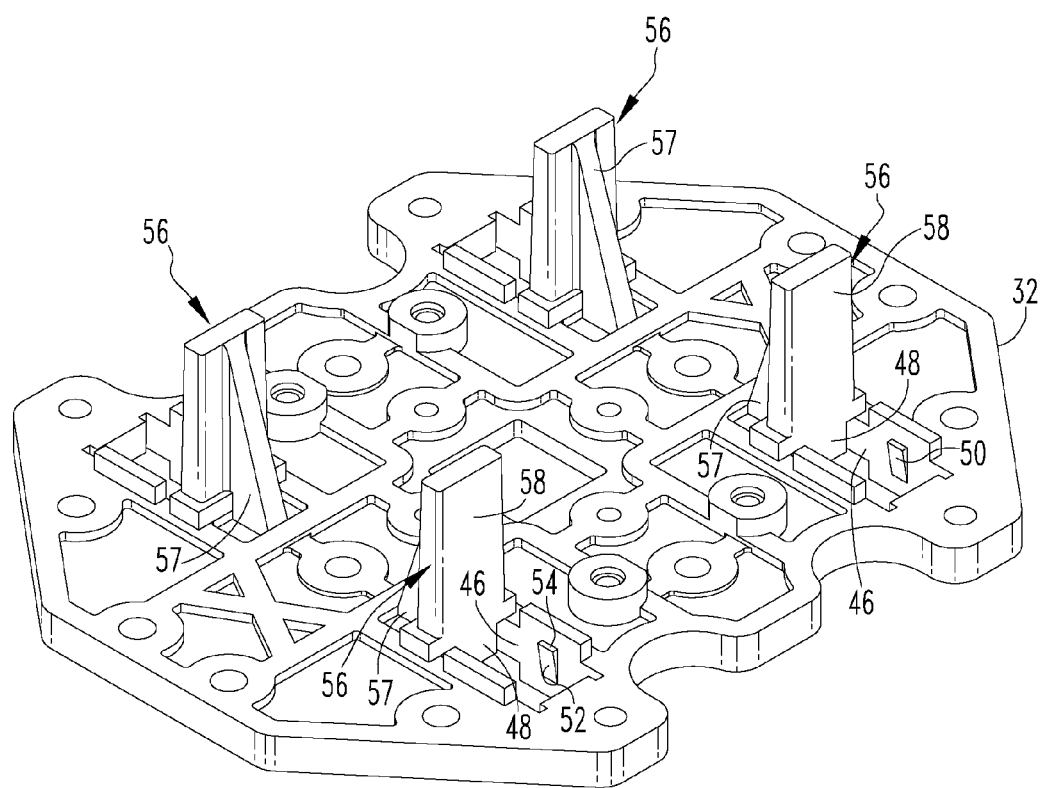
FIG. 2 is an isometric view of a meter socket plate in accordance with embodiments of the invention.
Figure 3:
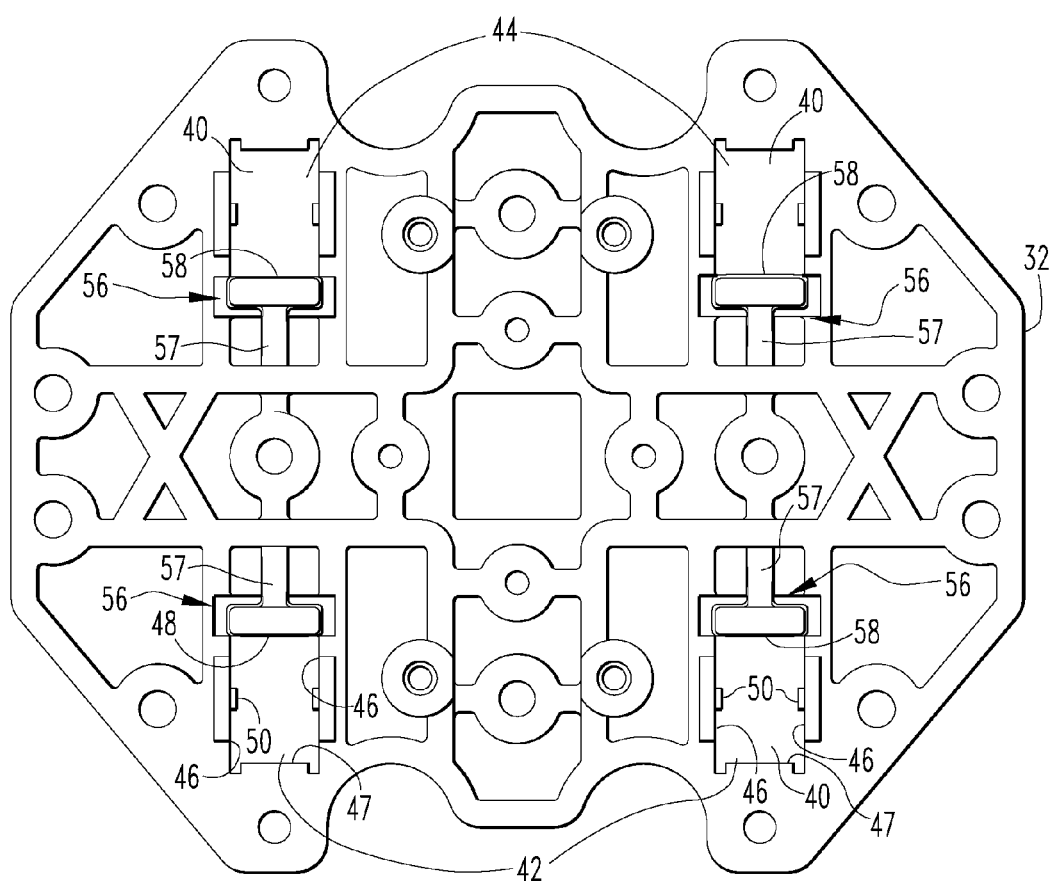
FIG. 3 is a plan view of the meter socket plate of FIG. 2.

As shown in FIG. 2, each guide member 56 has a support structure 57 and guide face 58. The support structure 57 provides a rigid backing for guide face 58, which is preferably substantially aligned with end wall 48 and oriented generally perpendicular to socket plate 32. Guide face 58 may be integrally formed with end wall 48 so as to form a continuous surface (as shown in FIG. 2) for guiding a meter jaw 34 (FIG. 4) into the correct position during assembly as well as to provide lateral support for the meter jaw 34 when fully installed in aperture 40 as described below.

Double ended meter jaws 34 are mounted in each of the apertures 40, as shown in FIG. 4. As best shown in FIG. 6, each of the meter jaws 34 includes a pair of elongated flat members 60. Flat members 60 each have a generally straight center section 62 and end sections 64 at each end which are bent back on but diverge from the center section 62. Terminal sections 66 extend generally toward each other from the end sections 64. The terminal sections 66 of the pair of elongated members 60 are clamped together in compliant confronting relationship by a pair of spring clips 68. The end sections 64 form a guide which centers the meter jaw 34 on a stab contact 70 such as a supply bus stab contact which then wedges between the terminal sections 66.

Referring to the removed meter jaw 34 of FIG. 4, an opening 72, is provided generally at a location midway between end sections 64 in the center section 62 of the two flat members 60, which make up one of the meter jaws 34. Thus, each assembled meter jaw 34 has a single, centrally located opening 72 on either side. Each opening 72 is of preferably, but not limited to, rectangular shape. The elongated flat members 60 of the meter jaws 34 have pairs of confronting tabs 74 bent out of the plane of the center section 62. Preferably, tabs 74 are provided along each side edge of the elongated flat members 60. Preferably, the spacing between the confronting tabs 74 is slightly less than, but in any event no greater than, the thickness, t, of the socket plate 32 (FIG. 5).

Socket assembly 30 is produced by locating meter jaws 34 in the apertures 40 of socket plate 32. This is initially accomplished by inserting one end 64 of a meter jaw 34 into one of the apertures 40. As shown in FIG. 4, end 64 of meter jaw 34 is inserted in one of the apertures 40 from the second surface 38 side of socket plate 32. As the meter jaw 34 encounters the sloped first face 52 of the two stops 50, the flat members 60 of the meter jaw 34 become compressed generally toward each other. When the meter jaw 34 has been inserted approximately half way into aperture 40, the opening 72 encounters the corresponding stop 50. Opening 70 is preferably sized to house therein the corresponding stop 50 and, thus, permit each of flat members 60 to return to generally their original separation. Once opening 70 has been moved in position to house stop 50, second face 54 acts upon an edge of opening 70, thus restricting movement of the meter jaw 34 in a direction opposite to that of insertion. In a preferred embodiment, guide face 58 is situated in relation to aperture 40 such that a portion of the meter jaw 34 travels along guide face 58 during installation and upon installation remains in contact with guide face 58. In other words, guide face 58 serves to guide meter jaw 34 into its proper location during installation and also serves to maintain the meter jaw 34 in such desired alignment relative to the meter plate 32.

In addition to the interaction between stops 50 and openings 70, a preferred embodiment of the meter socket assembly 30, as shown in the figures, includes confronting tabs 74 on meter jaw 34. Such tabs 74 nearest the inserted side of meter jaw 34, compress inwardly from opposing side walls 46 upon insertion of the meter jaw 34 into the aperture 40. After passing out the opposite side of the meter plate 32, confronting tabs 74 spring outward so as to engage first surface 36 of the meter plate 32. Similarly, the confronting tabs nearest the non-inserted end of the meter jaw 34, having not been compressed, engage second surface 38. The interaction between stops 50 and openings 72 as well as the engagement among the confronting tabs 74 and first and second surfaces 36, 38 serve to secure meter jaw 34 in meter plate 32 without need for any fastening members. The interaction between the pair of stops 50 and pair of openings 72 additionally provides the installed meter jaw 34 with greater resistance to high forces encountered during meter installation that would tend to force known jaw designs back through the meter plate.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A jaw assembly for a socket assembly of a meter center including at least one meter, said socket assembly including a plate member having a first side, an opposing second side and an aperture therethrough, said aperture having a periphery, said jaw assembly comprising:
   a meter jaw having a first end, a second end disposed opposite and distal from the first end, and a body portion having at least one opening, said body portion being structured to be disposed within said aperture; and
   at least one protrusion structured to extend inwardly from the periphery of said aperture, in order to engage said meter jaw at or about a corresponding one of said at least one opening.

2. The jaw assembly of claim 1, wherein the first end of said meter jaw is structured to extend outwardly from the first side of said plate member and the second end of the meter jaw is structured to extend outwardly from the second side of said plate member;
   wherein said meter jaw further has a first side and a second side disposed opposite from the first side of said meter jaw; and
   wherein said at least one opening is a first opening disposed on the first side of said meter jaw and a second opening disposed on the second side of said meter jaw.

3. The jaw assembly of claim 2, wherein said at least one protrusion is a first protrusion and a second protrusion; and
   wherein said first protrusion engages said first opening and said second protrusion engages said meter jaw at or about second opening.

4. The jaw assembly of claim 3 wherein said first protrusion and said second protrusion are structured to maintain said meter jaw in a predetermined position with respect to said plate member.

5. A socket assembly for a meter center including at least one meter, said meter having stabs, said socket assembly comprising:
   a plate member including a first side, an opposing second side and at least one aperture therethrough, said at least one aperture having a periphery;
   at least one guide member extending generally perpendicularly outwardly from the first side of said plate member at or about a corresponding one of said at least one aperture; and
   at least one jaw assembly comprising:
      a meter jaw having a first end, a second end disposed opposite and distal from the first end, and a body portion having at least one opening, said body portion being disposed within said corresponding one of said at least one aperture; and
      at least one protrusion structured to extend inwardly from the periphery of said corresponding one of said at least one aperture, in order to engage said meter jaw at or about a corresponding one of said at least one opening.

6. The socket assembly of claim 5, wherein said at least one guide member guides said meter jaw into a predetermined position with respect to said plate member.

7. The socket assembly of claim 5, wherein said at least one guide member comprises:
   a substantially planar surface oriented generally perpendicular to said first side of said plate member and positioned such that one of said at least one meter jaw abuts said substantially planar surface.

8. The socket assembly of claim 5, wherein said plate member is a single piece molded member; wherein each of said at least one guide member is a molded protrusion of said single piece molded member; and wherein said at least one protrusion is a molded protrusion of said single piece molded member.

9. The socket assembly of claim 5, wherein said at least one opening is a first opening and a second opening;
   wherein said at least one protrusion is a first protrusion and a second protrusion; and
   wherein said first protrusion engages said meter jaw at or about said first opening and said second protrusion engages said meter jaw at or about said second opening.

10. The socket assembly of claim 5, wherein the at least one aperture is two pairs of apertures with the apertures in each of said pairs being laterally spaced and with corresponding apertures in the two pairs being aligned.

11. The socket assembly of claim 10, wherein said meter jaw of said at least one jaw assembly further comprises a clamping element at said first end, said clamping element being structured to receive one of said stabs of said meter.

12. A meter center comprising:
   a cabinet comprising a meter compartment;
   a meter comprising a plurality of stabs; and
   a socket assembly enclosed by said meter compartment, said socket assembly comprising:
      a plate member including a first side, an opposing second side and at least one aperture therethrough;
      at least one guide member extending generally perpendicularly outwardly from the first side of said plate member at or about a corresponding one of said at least one aperture, said at least one aperture having a periphery; and
      at least one jaw assembly comprising:
         a meter jaw having a first end, a second end disposed opposite and distal from the first end, and a body portion having at least one opening, said body portion being disposed within said corresponding one of said at least one aperture; and
         at least one protrusion structured to extend inwardly from the periphery of said corresponding one of said at least one aperture, in order to engage said meter jaw at or about a corresponding one of said at least one opening.

13. The meter center of claim 12, wherein said at least one guide member is structured to guide said meter jaw into a predetermined position with respect to said plate member.

14. The meter center of claim 12, wherein said at least one guide member comprises:

a substantially planar surface oriented generally perpendicular to said first side of said plate member and positioned such that one of said at least one meter jaw abuts said substantially planar surface.

15. The meter center of claim 12, wherein said plate member is a single piece molded member; wherein each of said at least one guide member is a molded protrusion of said single piece molded member; and wherein said at least one protrusion is a molded protrusion of said single piece molded member.

16. The meter center of claim 12, wherein said at least one opening is a first opening and a second opening; wherein said at least one protrusion is a first protrusion and a second protrusion; and wherein said first protrusion engages said meter jaw at or about said first opening and said second protrusion engages said meter jaw at or about said second opening.

17. The meter center of claim 12, wherein the at least one aperture of the plate member is two pairs of apertures with the apertures in each of said pairs being laterally spaced and with corresponding apertures in the two pairs being aligned.

18. The meter center of claim 12, wherein said meter jaw of said at least one jaw assembly further comprises a clamping element at said first end, said clamping element receiving one of said stabs of said meter.

19. The meter center of claim 16, wherein the engagement of the first protrusion and said meter jaw at or about said first opening and the second protrusion and said meter jaw at or about said second opening inhibits removal of the meter jaw from one of two directions perpendicular to said first side and said second side.

20. The meter center of claim 19, wherein the first protrusion comprises a ramp surface oriented oblique to said first side and an engagement surface oriented generally parallel to said first side of said plate member.

* * * * *